United States Patent [19]
Jung

[11] Patent Number: 5,511,033
[45] Date of Patent: Apr. 23, 1996

[54] HIDDEN SELF-REFRESH METHOD AND APPARATUS FOR SYNCHRONOUS DYNAMIC RANDOM ACCESS MEMORY

[75] Inventor: Chang H. Jung, Kyoungki-do, Rep. of Korea

[73] Assignee: Hyundai Electronics Industries Co., Ltd., Kyoungki-do, Rep. of Korea

[21] Appl. No.: 335,648

[22] Filed: Nov. 8, 1994

[30] Foreign Application Priority Data

Nov. 8, 1993 [KR] Rep. of Korea ............... 93-23636

[51] Int. Cl.⁶ ........................... G11C 11/34
[52] U.S. Cl. .......... 365/222; 365/230.02; 365/230.03; 365/236
[58] Field of Search ................... 365/222, 236, 365/230.03, 230.02

[56] References Cited

U.S. PATENT DOCUMENTS

| | | | |
|---|---|---|---|
| 4,238,842 | 12/1980 | Aichelmann, Jr. | 365/222 |
| 4,494,222 | 1/1985 | White et al. | 365/222 |
| 4,914,630 | 4/1990 | Fujishima et al. | 365/189.04 |
| 4,933,907 | 6/1990 | Kumanoya et al. | 365/222 |
| 5,021,951 | 6/1991 | Baba | 365/222 X |
| 5,146,430 | 9/1992 | Torimaru et al. | 365/222 |
| 5,239,505 | 8/1993 | Faxio et al. | 365/185 |

*Primary Examiner*—David C. Nelms
*Assistant Examiner*—Son Dinh
*Attorney, Agent, or Firm*—Morgan & Finnegan

[57] ABSTRACT

Hidden self-refresh method and apparatus for a synchronous dynamic random access memory having at least two cell banks, each of the cell banks including a plurality of cell arrays. The hidden self-refresh apparatus comprises a first input line for inputting an external first address signal for addressing any one of the cell banks, a second input line for inputting an external second address signal for addressing any one of the cell arrays in the cell banks, a counter for generating a refresh address signal for addressing any one of the plurality of cell arrays in one of the cell banks corresponding to a logical value of the first address signal from the first input line, an address multiplexer for selecting either the refresh address signal from the counter or the second address signal from the second input line, and at least two latch circuits being individually driven according to the logical value of the first address signal from the first input line, each of the at least two latch circuits transferring the address signal selected by the address multiplexer to a corresponding one of the cell banks.

4 Claims, 4 Drawing Sheets

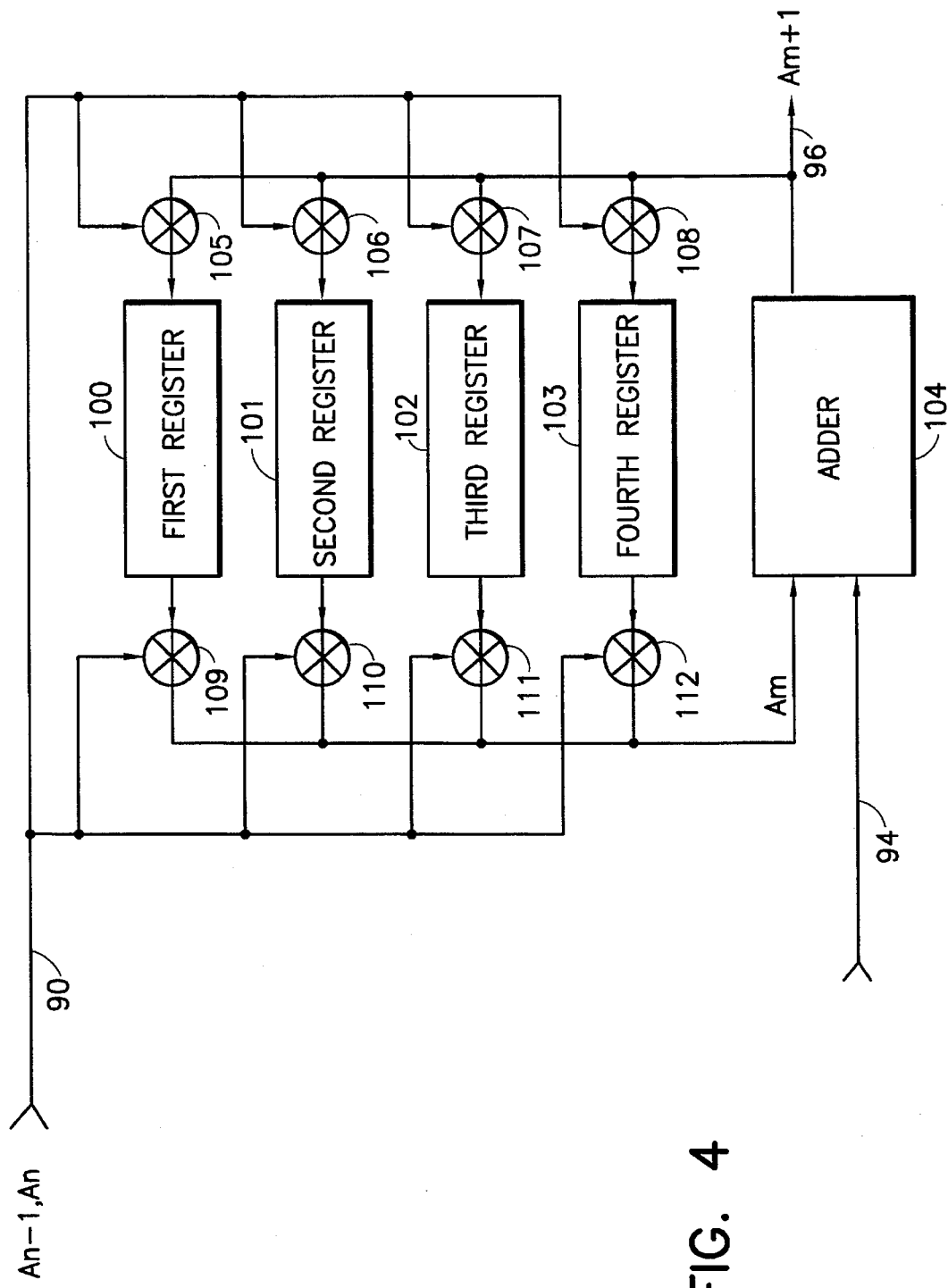

HIDDEN SELF-REFRESH METHOD AND APPARATUS FOR SYNCHRONOUS DYNAMIC RANDOM ACCESS MEMORY

BACKGROUND OF THE INVENTION

1. Field of the Invention

The present invention relates in general to a synchronous dynamic random access memory (referred to hereinafter as DRAM) having a plurality of cell banks, and more particularly to a hidden self-refresh method and apparatus for the synchronous DRAM in which self-refresh operations of the plurality of cell banks are individually controlled to enhance an operation speed of the synchronous DRAM.

2. Description of the Prior Art

Generally, a DRAM device comprises a plurality of cells, each of which consists of a capacitor for storing an electric charge therein and transistor for opening and closing charging and discharging paths of the capacitor. The electric charge stored in the capacitor is discharged little by little through a cell plate and the like with the lapse of time. For this reason, in the DRAM device, the DRAM cell must periodically be refreshed to make up for the electric charge into the cell capacitor.

In order to refresh the DRAM cell, a RAS only refresh method has been employed at the beginning. Thereafter, a CAS before RAS refresh method and a self-refresh method have recently been employed. Each of the CAS before RAS refresh method and the self-refresh method allows a chip to determine a refresh address for itself using an on-chip address counter.

However, the above-mentioned refresh methods all require a specified clock sequence from the outside to switch a present mode to a refresh mode. Also, the input and output are generally at an idle state for a time period that the refresh operation is performed. These result in a difficulty in a high-speed operation of the DRAM device. Further, in the case of a highly integrated memory device, a long refresh cycle is required for an effective operation of a chip. This long refresh cycle may degrade a reliability of the memory device since it comes to a limit of a cell data retention time.

For example, a conventional self-refresh apparatus will hereinafter be described briefly with reference to FIG. 1. As shown in FIG. 1, the conventional self-refresh apparatus comprises four cell banks 10–13 and four decoders 20–23 connected respectively to the four cell banks 10–13 to drive selectively row cell arrays thereof. The conventional self-refresh apparatus also comprises a self-refresh oscillator/timer circuit 40 for generating a clock signal, a refresh counter 50 for generating a refresh address signal in response to the clock signal from the self-refresh oscillator/timer circuit 40, and a row address latch circuit 70 for temporarily storing an external row address signal. Further, the conventional self-refresh apparatus comprises an address multiplexer 60 for selecting either the refresh address signal from the refresh counter 50 or the external row address signal from the row address latch circuit 70, and four row address buffers 30–33 for buffering the address signal selected by the address multiplexer 60 and applying the buffered address signal to the four decoders 20–23, respectively.

In operation, in a data access mode, the address multiplexer 60 transfers the external row address signal A0-An from the row address latch circuit 70 to the four decoders 20–23 through the four row address buffers 30–33, respectively. Each of the four decoders 20–23, when the external row address signal A0-An has a logical value addressing the cell bank connected thereto, drives a corresponding one of the row cell arrays in the addressed cell bank.

In a self-refresh mode, the address multiplexer 60 transfers the refresh address signal from the refresh counter 50 to the four decoders 20–23 through the four row address buffers 30–33, respectively. Each of the four decoders 20–23, when the refresh address signal has a logical value addressing the cell bank connected thereto, drives a corresponding one of the row cell arrays in the addressed cell bank.

The self-refresh oscillator/timer circuit 40 and the refresh counter 50 are driven only in the self-refresh mode to generate the clock signal and the refresh address signal, respectively. In the data access mode, the refresh counter 50 maintains its initial state and the self-refresh oscillator/timer circuit 40 generates no clock signal.

However, the above-mentioned conventional self-refresh apparatus has a disadvantage in that the data access operation cannot be performed in the refresh mode because the row address signal is applied in common to the cell banks 10–13 and the self-refresh oscillator/timer circuit 40 and the refresh counter 50 are driven only in the refresh mode. In other words, the data access operation cannot be performed in the refresh mode since the switching of the refresh mode and the data access mode is controlled by a row address strobe signal and a column address strobe signal from the outside and, furthermore, the external address signal cannot be inputted to the row address latch circuit in the refresh mode. Also, when the refresh mode is stopped, the refresh counter 50 is initialized, resulting in a loss of data stored in the row cell arrays which are not addressed. In result, the above-mentioned conventional self-refresh apparatus cannot enhance a data access speed of the DRAM device.

SUMMARY OF THE INVENTION

Therefore, the present invention has been made in view of the above problem, and it is an object of the present invention to provide a hidden self-refresh method and apparatus for a synchronous DRAM in which self-refresh operations of a plurality of cell banks are individually controlled to enhance a data access operation of the synchronous DRAM.

In accordance with one aspect of the present invention, there is provided a method of controlling a hidden self-refresh operation of a synchronous dynamic random access memory having at least two cell banks, each of said cell banks including a plurality of cell arrays, comprising the steps of inputting an external first address signal for addressing any one of said cell banks; generating a refresh address signal for addressing any one of the plurality of cell arrays in one of said cell bank corresponding to a logical value of said first address signal; inputting an external second address signal for addressing any one of said cell arrays in said cell banks; selecting successively said second address signal and said refresh address signal; and latching said successively selected address signals dispersedly to said cell banks according to the logical value of said first address signal in such a manner that respective applications of said second address signal and said refresh address signal to said cell banks coincide partially with each other.

In accordance with another aspect of the present invention, in a synchronous dynamic random access memory having at least two cell banks, each of said cell banks including a plurality of cell arrays, there is provided a hidden self-refresh apparatus comprising first input means for inputting an external first address signal for addressing any one of said cell banks; second input means for inputting an external second address signal for addressing any one of said cell arrays in said cell banks; counting means for generating a refresh address signal for addressing any one of the plurality of cell arrays in one of said cell banks corresponding to a logical value of said first address signal from said first input means; multiplexing means for selecting either the said refresh address signal from said counting means or the said second address signal from said second input means; and at least two latch means being individually driven according to the logical value of said first address signal from said first input means, each of said at least two latch means transferring the address signal selected by said multiplexing means to a corresponding one of said cell banks.

BRIEF DESCRIPTION OF THE DRAWINGS

The above and other objects, features and advantages of the present invention will be more clearly understood from the following detailed description taken in conjunction with the accompanying drawings, in which:

FIG. 4 is a detailed block diagram of a refresh counter in FIG. 3.

DETAILED DESCRIPTION OF THE PREFERRED EMBODIMENTS

Figure 1:
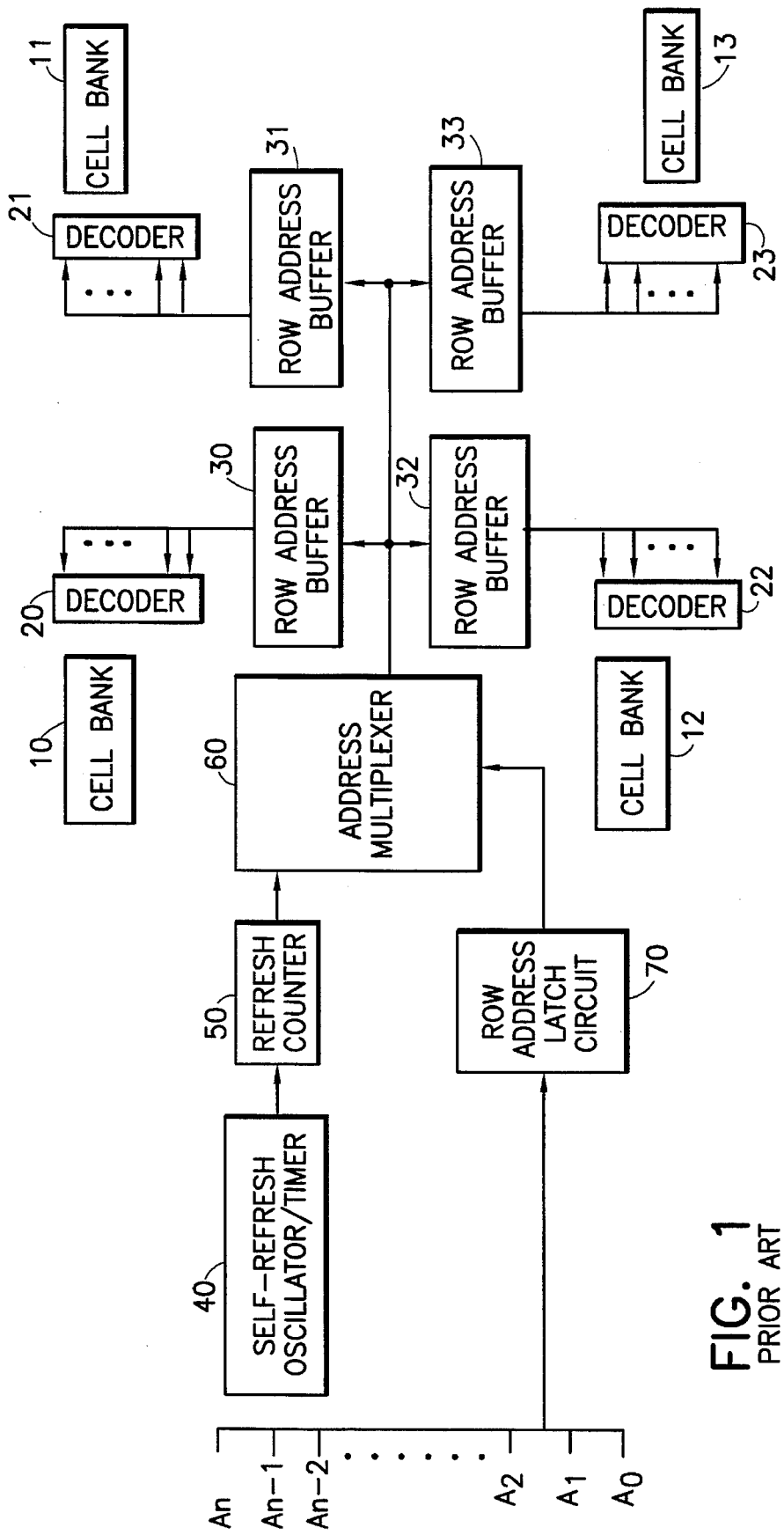
FIG. 1 is a block diagram of a conventional self-refresh apparatus.
Figure 2:
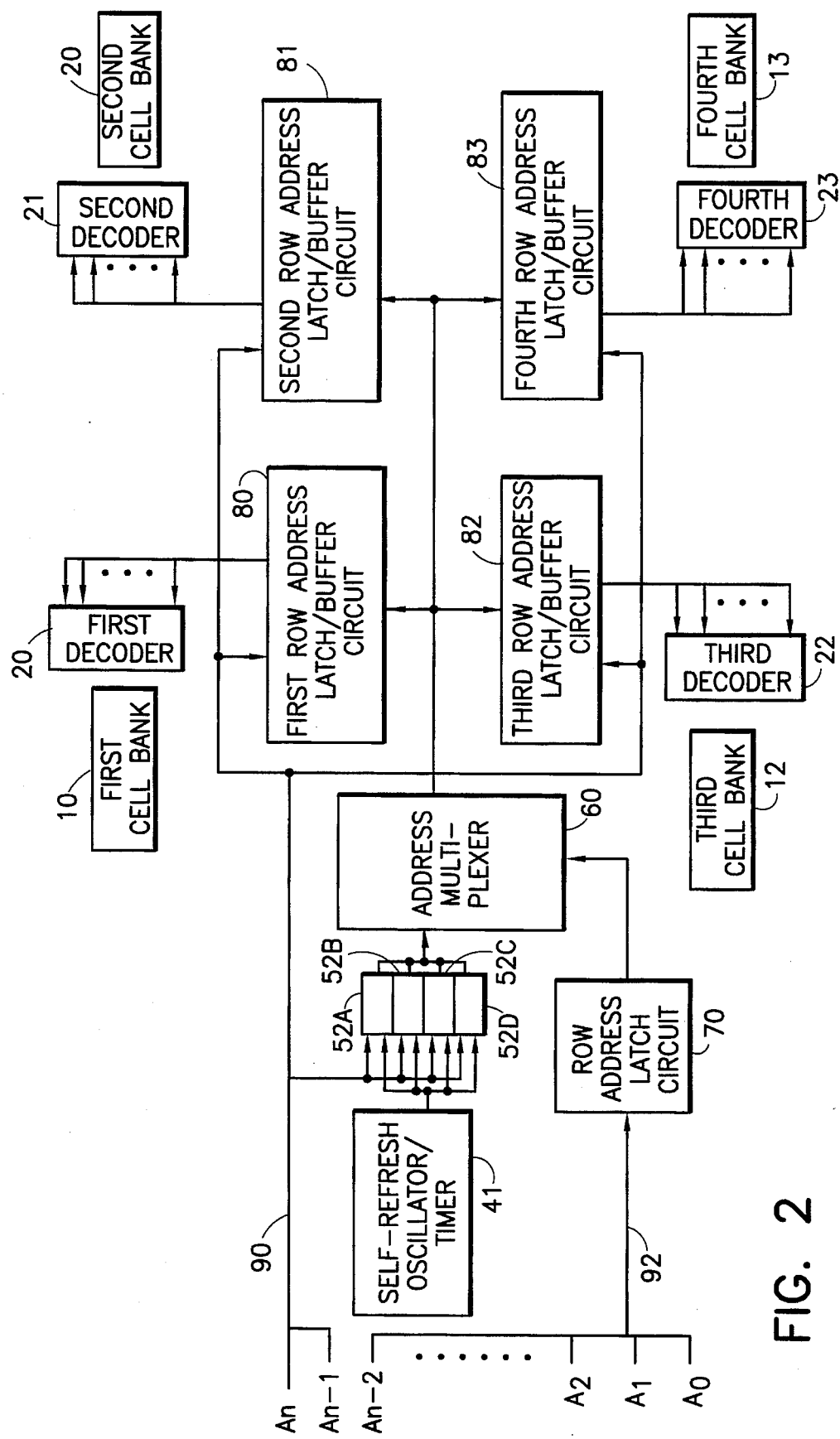
FIG. 2 is a block diagram of a hidden self-refresh apparatus for a synchronous DRAM in accordance with a first embodiment of the present invention.

Referring to FIG. 2, there is shown a block diagram of a hidden self-refresh apparatus for a synchronous DRAM in accordance with a first embodiment of the present invention. Some of the parts in this drawing are the same as those in FIG. 1. Therefore, like reference numerals designate like parts.

As shown in FIG. 2, the hidden self-refresh apparatus for the synchronous DRAM comprises first to fourth refresh counters 52A–52D for inputting commonly a first row address signal $A_{n-1}$ and $A_n$ from a first input line 90, a self-refresh oscillator/timer circuit 41 for generating a clock signal, and the row address latch circuit 70 for inputting a second row address signal $A_0$–$A_{n-2}$ from a second input line 92. Also, the hidden self-refresh apparatus for the synchronous DRAM comprises the first to fourth cell banks 10–13, each of which includes the plurality of cell arrays, and the first to fourth decoders 20–23 connected respectively to the first to fourth cell banks 10–13.

The first row address signal $A_{n-1}$ and $A_n$ has a logical value addressing any one of the first to fourth cell banks 10–13 and the second row address signal $A_0$–$A_{n-2}$ has a logical value addressing any one of the cell arrays of the first to fourth cell banks 10–13. The first and second row address signals $A_0$–$A_n$ may be generated from an external unit such as, for example, a microcomputer.

The self-refresh oscillator/timer circuit 41 generates the clock signal regardless of the refresh mode and the data access mode, the generated clock signal having a fixed period. The clock signal from the self-refresh oscillator/timer circuit 41 is applied in common to the first to fourth refresh counters 52A–52D.

The first to fourth refresh counters 52A–52D are operated in complementary cooperation with one another according to the logical value of the first row address signal $A_{n-1}$ and $A_n$. For example, if the logical value of the first row address signal $A_{n-1}$ and $A_n$ is "00", the first refresh counter 52A is driven. If the logical value of the first row address signal $A_{n-1}$ and $A_n$ is "01", "10" or "11", the second, third or fourth refresh counter 52B, 52C or 52D is driven. When being driven in response to the first row address signal $A_{n-1}$ and $A_n$, a corresponding one of the first to fourth refresh counters 52A–52D performs an up or down counting operation by one whenever it inputs the clock signal from the self-refresh oscillator/timer circuit 41. Then, the driven refresh counter applies its count as a refresh address signal to the address multiplexer 60. On the other hand, the refresh counters, not selected by the first row address signal $A_{n-1}$ and $A_n$, maintain their final counts as they are.

The row address latch circuit 70 latches the second row address signal $A_0$–$A_{n-2}$ from the second input line 92 and applies the latched second row address signal $A_0$–$A_{n-2}$ to the address multiplexer 60. In the refresh mode, the address multiplexer 60 selects the refresh address signal from any one of the first to fourth refresh counters 52A–52D. In the data access mode, the address multiplexer 60 selects the latched second row address signal $A_0$–$A_{n-2}$ from the row address latch circuit 70. The address multiplexer 60 is switched according to a logical state of an external automatic refresh control signal, although not shown.

The hidden self-refresh apparatus for the synchronous DRAM further comprises first to fourth row address latch/buffer circuits 80–83 for inputting commonly the address signal selected by the address multiplexer 60. The first to fourth row address latch/buffer circuits 80–83 also input commonly the first row address signal $A_{n-1}$ and $A_n$ from the first input line 90. The first to fourth row address latch/buffer circuits 80–83 are operated in complementary cooperation with one another according to the logical value of the first row address signal $A_{n-1}$ and $A_n$. For example, if the logical value of the first row address signal $A_{n-1}$ and $A_n$ is "00", the first row address latch/buffer circuit 80 performs a latch operation. If the logical value of the first row address signal $A_{n-1}$ and $A_n$ is "01", "10" or "11", the second, third or fourth row address latch/buffer circuit 81, 82 or 83 performs a latch operation. Each of the first to fourth row address latch/buffer circuits 80–83 includes a latch circuit for latching the address signal from the address multiplexer 60 and a buffer for transferring the address signal latched by the latch circuit to one of the first to fourth decoders 20–23 connected to its output terminal. In result, the first row address latch/buffer circuit 80 inputs the refresh address signal from the first refresh counter 52A or the latched second row address signal $A_0$–$A_{n-2}$ from the row address latch circuit 70 and transfers the inputted address signal to the first decoder 20. Similarly, the second row address latch/buffer circuit 81 inputs the refresh address signal from the second refresh counter 52B or the latched second row address signal $A_0$–$A_{n-2}$ from the row address latch circuit 70 and transfers the inputted address signal to the second decoder 21. The third row address latch/buffer circuit 82 inputs the refresh address signal from the third refresh counter 52C or the latched second row address signal $A_0$–$A_{n-2}$ from the row address latch circuit 70 and transfers the inputted address signal to the third decoder 22. The fourth row address latch/buffer circuit 83 inputs the refresh address signal from the fourth refresh counter 52D or the latched second row address signal $A_0$–$A_{n-2}$ from the row address latch circuit 70 and transfers the inputted address signal to the fourth decoder 23.

Although any one of the first to fourth cell banks 10–13 is in the refresh mode, the first to fourth row address latch/buffer circuits 80–83 are adapted to transfer the latched second row address signal $A_0$–$A_{n-2}$ from the row address latch circuit 70 to the remaining three cell banks to make the data access operation possible even in the refresh mode. The hidden self-refresh apparatus for the synchronous DRAM can control the refresh operations of the plurality of cell banks individually according to high-order bits of the row address signal addressing the cell banks.

Figure 3:
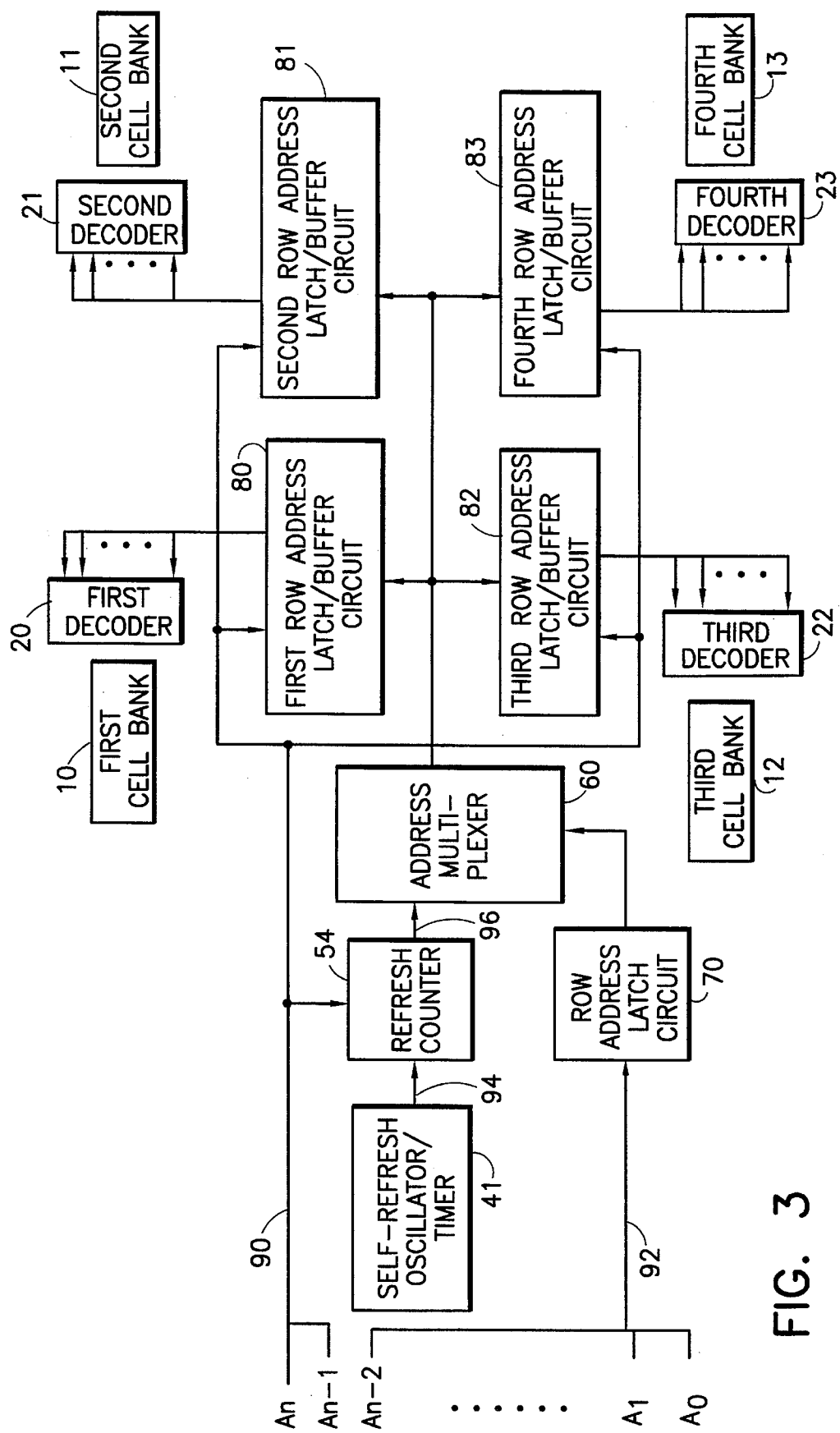
FIG. 3 is a block diagram of a hidden self-refresh apparatus for a synchronous DRAM in accordance with a second embodiment of the present invention.

Referring to FIG. 3, there is shown a block diagram of a hidden self-refresh apparatus for a synchronous DRAM in accordance with a second embodiment of the present invention. Some of the parts in this drawing are the same as those in FIG. 2. Therefore, like reference numerals designate like parts.

As shown in FIG. 3, the hidden self-refresh apparatus for the synchronous DRAM comprises a refresh counter 54 for inputting the first row address signal $A_{n-1}$ and $A_n$ from the first input line 90, the self-refresh oscillator/timer circuit 41 for generating the clock signal, and the row address latch circuit 70 for inputting the second row address signal $A_0$–$A_{n-2}$ from the second input line 92. Also, the hidden self-refresh apparatus for the synchronous DRAM comprises the first to fourth cell banks 10–13, each of which includes the plurality of cell arrays, and the first to fourth decoders 20–23 connected respectively to the first to fourth cell banks 10–13.

The first row address signal $A_{n-1}$ and $A_n$ has the logical value addressing any one of the first to fourth cell banks 10–13 and the second row address signal $A_0$–$A_{n-2}$ has the logical value addressing any one of the cell arrays of the first to fourth cell banks 10–13. The first and second row address signals $A_0$–$A_n$ may be generated from the external unit such as, for example, a microcomputer.

The self-refresh oscillator/timer circuit 41 generates the clock signal regardless of the refresh mode and the data access mode, the generated clock signal having the fixed period. The clock signal from the self-refresh oscillator/timer circuit 41 is applied to the refresh counter 54.

The refresh counter 54, as shown in FIG. 4, includes first to fourth registers 100–103 for storing temporarily the refresh address signal and an adder 104 for adding "1" to a logical value of the refresh address signal from any one of the first to fourth registers 100–103 and outputting the resultant new refresh address signal. The refresh counter 54 also includes first to fourth control switches 105–108 connected respectively between an output line 96 of the adder 104 and input terminals of the first to fourth registers 100–103 and fifth to eighth control switches 109–112 connected respectively between output terminals of the first to fourth registers 100–103 and an input terminal of the adder 104.

The first to eighth control switches 105–112 are operated according to the logical value of the first row address signal $A_{n-1}$ and $A_n$ from the first input line 90 shown in FIG. 3. For example, if the logical value of the first row address signal $A_{n-1}$ and $A_n$ is "00", the first control switch 105 transfers the refresh address signal counted by the adder 104 to the input terminal of the first register 100 and the fifth control switch 109 transfers the refresh address signal from the first register 100 to the input terminal of the adder 104. If the logical value of the first row address signal $A_{n-1}$ and $A_n$ is "01", the second control switch 106 transfers the refresh address signal counted by the adder 104 to the input terminal of the second register 101 and the sixth control switch 110 transfers the refresh address signal from the second register 101 to the input terminal of the adder 104. If the logical value of the first row address signal $A_{n-1}$ and $A_n$ is "10", the third control switch 107 transfers the refresh address signal counted by the adder 104 to the input terminal of the third register 102 and the seventh control switch 111 transfers the refresh address signal from the third register 102 to the input terminal of the adder 104. Similarly, if the logical value of the first row address signal $A_{n-1}$ and $A_n$ is "11", the fourth control switch 108 transfers the refresh address signal counted by the adder 104 to the input terminal of the fourth register 103 and the eighth control switch 112 transfers the refresh address signal from the fourth register 103 to the input terminal of the adder 104. In result, the first to fourth registers 100–103 store addresses of the finally refreshed row cell arrays in the first to fourth cell banks 10–13, respectively.

The adder 104 has a clock terminal for inputting the clock signal from an output terminal 94 of the self-refresh oscillator/timer circuit 41. Whenever receiving the clock signal from the self-refresh oscillator/timer circuit 41, the adder 104 adds "1" to the logical value of the refresh address signal from any one of the first to fourth registers 100–103 and outputs the resultant new refresh address signal. The new refresh address signal $A_{n+1}$ from the adder 104 is applied through the output terminal 96 of the adder 104 in common to the first to fourth control switches 105–108 and to the address multiplexer 60 shown in FIG. 3.

The row address latch circuit 70 latches the second row address signal $A_0$–$A_{n-2}$ from the second input line 92 and applies the latched second row address signal $A_0$–$A_{n-2}$ to the address multiplexer 60. The address multiplexer 60 selects the refresh address signal from the refresh counter 54 in the refresh mode, whereas the latched second row address signal $A_0$–$A_{n-2}$ from the row address latch circuit 70 in the data access mode. The address multiplexer 60 is switched according to the logical state of the external automatic refresh control signal, although not shown.

The hidden self-refresh apparatus for the synchronous DRAM further comprises the first to fourth row address latch/buffer circuits 80–83 for inputting commonly the address signal selected by the address multiplexer 60. The first to fourth row address latch/buffer circuits 80–83 also input commonly the first row address signal $A_{n-1}$ and $A_n$ from the first input line 90. The first to fourth row address latch/buffer circuits 80–83 are operated in complementary cooperation with one another according to the logical value of the first row address signal $A_{n-1}$ and $A_n$. For example, if the logical value of the first row address signal $A_{n-1}$ and $A_n$ is "00", the first row address latch/buffer circuit 80 performs the latch operation. If the logical value of the first row address signal $A_{n-1}$ and $A_n$ is "01", "10" or "11", the second, third or fourth row address latch/buffer circuit 81, 82 or 83 performs the latch operation. Each of the first to fourth row address latch/buffer circuits 80–83 includes the latch circuit for latching the address signal from the address multiplexer 60 and the buffer for transferring the address signal latched by the latch circuit to one of the first to fourth decoders 20–23 connected to its output terminal. In result, the first row address latch/buffer circuit 80 inputs the first-cell bank refresh address signal counted by the refresh counter 54 or the latched second row address signal $A_0$–$A_{n-2}$ from the row address latch circuit 70 and transfers the inputted address signal to the first decoder 20. Similarly, the second row address latch/buffer circuit 81 inputs the second-cell bank refresh address signal counted by the refresh counter 54 or the latched second row address signal $A_0$–$A_{n-2}$ from the row address latch circuit 70 and transfers the inputted address signal to the second decoder 21. The third row address latch/buffer circuit 82 inputs the third-cell bank refresh address signal counted by the refresh counter 54 or the latched second row address signal $A_0$–$A_{n-2}$ from the row address latch circuit 70 and transfers the inputted address signal to the third decoder 22. The fourth row address latch/buffer circuit 83 inputs the fourth-cell bank refresh address signal counted by the refresh counter 54 or the latched second row address signal $A_0$–$A_{n-2}$ from the row address latch circuit 70 and transfers the inputted address signal to the fourth decoder 23.

As apparent from the above description, according to the present invention, the hidden self-refresh apparatus for the synchronous DRAM can apply the address signals individually to the plurality of cell banks using the row address latch/buffer circuits of the same number as that of the cell banks. Also, the hidden self-refresh apparatus for the synchronous DRAM can perform the refresh operations of the plurality of cell banks individually by generating the refresh address signals individually to the plurality of cell banks. Further, the hidden self-refresh apparatus for the synchronous DRAM can freely perform the mode switching operation from the refresh mode to the data access mode and vice-versa using the external cell bank address signal. Therefore, the hidden self-refresh apparatus for the synchronous DRAM in accordance with the present invention has the effect of enhancing the data access speed of the DRAM device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of controlling a hidden self-refresh operation of a synchronous dynamic random access memory having at least two cell banks, each of said cell banks including a plurality of cell arrays, comprising the steps of:

inputting an external first address signal for addressing any one of said cell banks;

generating a refresh address signal for addressing any one of the plurality of cell arrays in one of said cell banks corresponding to a logical value of said first address signal;

inputting an external second address signal for addressing any one of said cell arrays in said cell banks;

selecting successively said second address signal and said refresh address signal; and latching said successively selected address signals dispersedly to said cell banks according to the logical value of said first address signal in such a manner that respective applications of said second address signal and said refresh address signal to said cell banks coincide partially with each other.

2. In a synchronous dynamic random access memory having at least two cell banks, each of said cell banks including a plurality of cell arrays, a hidden self-refresh apparatus comprising:

first input means for inputting an external first address signal for addressing any one of said cell banks;

second input means for inputting an external second address signal for addressing any one of said cell arrays in said cell banks;

counting means for generating a refresh address signal for addressing any one of the plurality of cell arrays in one of said cell banks corresponding to a logical value of said first address signal from said first input means;

multiplexing means for selecting either said refresh address signal from said counting means or said second address signal from said second input means; and at least two latch means being individually driven according to the logical value of said first address signal from said first input means, each of said at least two latch means transferring the refresh or second address signals selected by said multiplexing means to a corresponding one of said cell banks.

3. A hidden self-refresh apparatus as set forth in claim 2, wherein said counting means includes:

at least two registers, each of said at least two registers storing an address of the finally refreshed cell array in a corresponding one of said cell banks;

addition means for adding 1 to said refresh address signal from any one of said at least two registers and outputting the resultant refresh address signal to said multiplexing means;

at least two switching devices being individually driven according to the logical value of said first address signal from said first input means, each of said at least two switching devices transferring said refresh address signal from said addition means to a corresponding one of said at least two registers; and at least two switching devices being individually driven according to the logical value of said first address signal from said first input means, each of said at least two switching devices transferring said refresh address signal from a corresponding one of said at least two registers to said addition means.

4. In a synchronous dynamic random access memory having at least two cell banks, each of said cell banks including a plurality of cell arrays, a hidden self-refresh apparatus comprising:

first input means for inputting an external first address signal for addressing said cell banks;

second input means for inputting an external second address signal for addressing any one of said cell arrays in said cell banks;

at least two counting means being individually driven according to a logical value of said first address signal from said first input means, each of said at least two counting means generating a refresh address signal for addressing any one of the plurality of cell arrays in one of said cell banks corresponding to the logical value of said first address signal from said first input means;

multiplexing means for selecting either said refresh address signal from any one of said at least two counting means or said second address signal from said second input means; and at least two latch means being individually driven according to the logical value of said first address signal from said first input means, each of said at least two latch means transferring the refresh and second address signals selected by said multiplexing means to a corresponding one of said cell banks.

* * * * *